(12) United States Patent
Oh et al.

(10) Patent No.: US 10,156,920 B2
(45) Date of Patent: Dec. 18, 2018

(54) PIXEL, DISPLAY PANEL INCLUDING THE PIXEL, AND METHOD OF MANUFACTURING THE DISPLAY PANEL

(71) Applicant: Samsung Display Co., Ltd., Yongin-si, Gyeonggi-do (KR)

(72) Inventors: Joon Hak Oh, Yongin si (KR); Jong Seo Lee, Yongin si (KR)

(73) Assignee: Samsung Display Co., Ltd. (KR)

( * ) Notice: Subject to any disclaimer, the term of this patent is extended or adjusted under 35 U.S.C. 154(b) by 58 days.

(21) Appl. No.: 15/354,189

(22) Filed: Nov. 17, 2016

(65) Prior Publication Data

US 2017/0139518 A1  May 18, 2017

(30) Foreign Application Priority Data

Nov. 17, 2015  (KR) .................. 10-2015-0161213

(51) Int. Cl.
| | |
|---|---|
| *G06F 3/041* | (2006.01) |
| *G06F 3/047* | (2006.01) |
| *H01L 27/12* | (2006.01) |
| *H01L 41/29* | (2013.01) |
| *H01L 41/113* | (2006.01) |

(52) U.S. Cl.
CPC ............ *G06F 3/0414* (2013.01); *G06F 3/047* (2013.01); *G06F 3/0416* (2013.01); *H01L 27/124* (2013.01); *H01L 27/1225* (2013.01); *H01L 27/1259* (2013.01); *H01L 41/29* (2013.01); *G06F 2203/04103* (2013.01); *H01L 41/1132* (2013.01)

(58) Field of Classification Search
CPC ...... G06F 3/0414; G06F 3/0416; G06F 3/047; G06F 2203/04103; H01L 27/1225; H01L 27/124; H01L 27/1259; H01L 41/29; H01L 41/1132
See application file for complete search history.

(56) References Cited

U.S. PATENT DOCUMENTS

| | | | |
|---|---|---|---|
| 7,605,523 B2 | 10/2009 | Katsuki et al. | |
| 8,350,817 B2 | 1/2013 | Yamato et al. | |
| 2004/0213440 A1* | 10/2004 | Joo ..................... | G06K 9/0002 382/124 |
| 2014/0362304 A1* | 12/2014 | Wang .................... | G06F 3/0412 349/12 |
| 2015/0123931 A1* | 5/2015 | Kitchens ............... | G06F 3/0414 345/174 |
| 2016/0328074 A1* | 11/2016 | Peng ...................... | G06F 3/047 |
| 2017/0090028 A1* | 3/2017 | Djordjev ................ | G01S 15/89 |

\* cited by examiner

*Primary Examiner* — Premal R Patel
(74) *Attorney, Agent, or Firm* — Innovation Counsel LLP (57) ABSTRACT

There is provided a pixel. The pixel includes a pixel transistor including a gate electrode provided on a substrate and protruding from a scan line, an active pattern provided on the gate electrode, a first electrode provided on the active pattern, and a second electrode provided on the active pattern and protruding from a data line and a piezoelectric sensor including a first touch electrode provided on the substrate and a piezoelectric pattern provided on the first touch electrode. The gate electrode and the first touch electrode are formed of a same material. The active pattern and the piezoelectric pattern are formed of a same material.

13 Claims, 9 Drawing Sheets

PIXEL, DISPLAY PANEL INCLUDING THE PIXEL, AND METHOD OF MANUFACTURING THE DISPLAY PANEL

CROSS-REFERENCE TO RELATED APPLICATION

This application claims priority to and the benefit of Korean Patent Application No. 10-2015-0161213, filed on Nov. 17, 2015, in the Korean Intellectual Property Office, the entire contents of which are incorporated herein by reference in their entirety.

BACKGROUND

1. Field

An embodiment of the present inventive concept relates to a pixel, a display panel including the pixel, and a method of manufacturing the display panel.

2. Description of the Related Art

With the development of a smart device, when a hand of a person or an object touches a display panel, it is required to mount a touch sensor capable of recognizing a position of the hand or the object in the display panel.

Recently, a display panel mounted with a touch sensor capable of recognizing an intensity of touch pressure as well as whether a touch is performed is required. There are problems such as complexity of processes and increase of cost in implementing the display panel having a touch sensor capable of recognizing an intensity of touch pressure as well as whether a touch is performed is required. Research on solving the problems is being performed.

SUMMARY

An embodiment of the present inventive concept relates to a pixel capable of recognizing a degree of touch pressure without excessively increasing the number of masks, a display panel including the pixel, and a method of manufacturing the display panel.

A pixel according to an embodiment of the present inventive concept includes a pixel transistor including a gate electrode provided on a substrate and protruding from a scan line, an active pattern provided on the gate electrode, a first electrode provided on the active pattern, and a second electrode provided on the active pattern and protruding from a data line and a piezoelectric sensor including a first touch electrode provided on the substrate and a piezoelectric pattern provided on the first touch electrode. The gate electrode and the first touch electrode may be formed of a same material. The active pattern and the piezoelectric pattern may be formed of a same material.

The piezoelectric sensor further includes a second touch electrode provided on the piezoelectric pattern. The first electrode and the second touch electrode may be formed of a same material.

The active pattern includes an oxide semiconductor.

The oxide semiconductor may be zinc oxide.

The pixel further includes a sensing transistor. The sensing transistor further includes a sensing gate electrode provided on the substrate and protruding from a driving line, a sensing active pattern provided on the sensing gate electrode, a first sensing electrode provided on the sensing active pattern, and a second sensing electrode provided on the sensing active pattern and protruding from a sensing line. The first sensing electrode and the second touch electrode are connected to each other. The gate electrode and the sensing gate electrode may be formed of a same material, the active pattern and the sensing active pattern may be formed of a same material, and the first electrode and the first sensing electrode may be formed of a same material.

The pixel transistor further includes an insulating pattern provided between the gate electrode and the active pattern. The sensing transistor further includes a sensing insulating pattern provided between the sensing gate electrode and the sensing active pattern. The insulating pattern and the sensing insulating pattern may be formed of a same material.

When a touch of a user occurs around the pixel, voltage levels of the piezoelectric pattern and the first sensing electrode are changed by the touch. When a driving signal is supplied to the driving line, a voltage of the sensing line changes.

A display panel including a pixel according to another embodiment of the present inventive concept includes pixels provided in a display area, scan lines configured to transmit scan signals to the pixels, data lines configured to transmit data voltages to the pixels, piezoelectric sensors at least partially provided outside the display area, and sensing lines connected to the piezoelectric sensors to receive sensing signals from the piezoelectric sensors. At least one of the pixels includes a pixel transistor. The pixel transistor includes a gate electrode provided on a substrate and protruding from one of the scan lines, an active pattern provided on the gate electrode, a first electrode provided on the active pattern, and a second electrode provided on the active pattern and protruding from one of the data lines. A first piezoelectric sensor among the piezoelectric sensors includes a first touch electrode provided on the substrate and a piezoelectric pattern provided on the first touch electrode. The gate electrode and the first touch electrode may be formed of a same material, the active pattern and the piezoelectric pattern may be formed of a same material, and the first electrode and the second touch electrode may be formed of a same material.

When a touch of a user occurs around the first piezoelectric sensor, voltage levels of the piezoelectric pattern and the first touch electrode are changed by the touch.

The first piezoelectric sensor further includes a second touch electrode provided on the piezoelectric pattern. A material of which the first electrode is substantially equal to a material of which the second touch electrode is formed.

When a touch of a user occurs around the first piezoelectric sensor, a difference in voltage level between the first touch electrode and the second touch electrode is changed by the touch.

A method of manufacturing a display panel according to another embodiment of the present inventive concept includes simultaneously forming a gate electrode and a first touch electrode on a substrate, forming an insulating pattern having an opening on at least a part of the first touch electrode, and forming an active pattern on the insulating pattern and a piezoelectric pattern on the opening at the same time.

In the simultaneously forming of the gate electrode and the first touch electrode, a sensing gate electrode is further formed. In the forming of the piezoelectric pattern, a sensing active pattern is further formed on the insulating pattern.

The method further includes forming a first electrode and a second electrode on the active pattern and forming a second touch electrode on the piezoelectric pattern at the same time.

According to the embodiments of the present inventive concept, it is possible to provide a pixel capable of recognizing a degree of touch pressure without excessively increasing the number of masks, a display panel including the pixel, and a method of manufacturing the display panel.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments of the present inventive concept will be described in detail with reference to the accompanying drawings. Like reference numerals refer to like elements throughout. In describing the present inventive concept, when a detailed description of a well-known function or configuration related to the present inventive concept is considered to unnecessarily obscure the gist of the present inventive concept, the detailed description will not be given. Names of elements used in the following description are selected for the description purpose and may be different from those of actual products.

Figure 1:
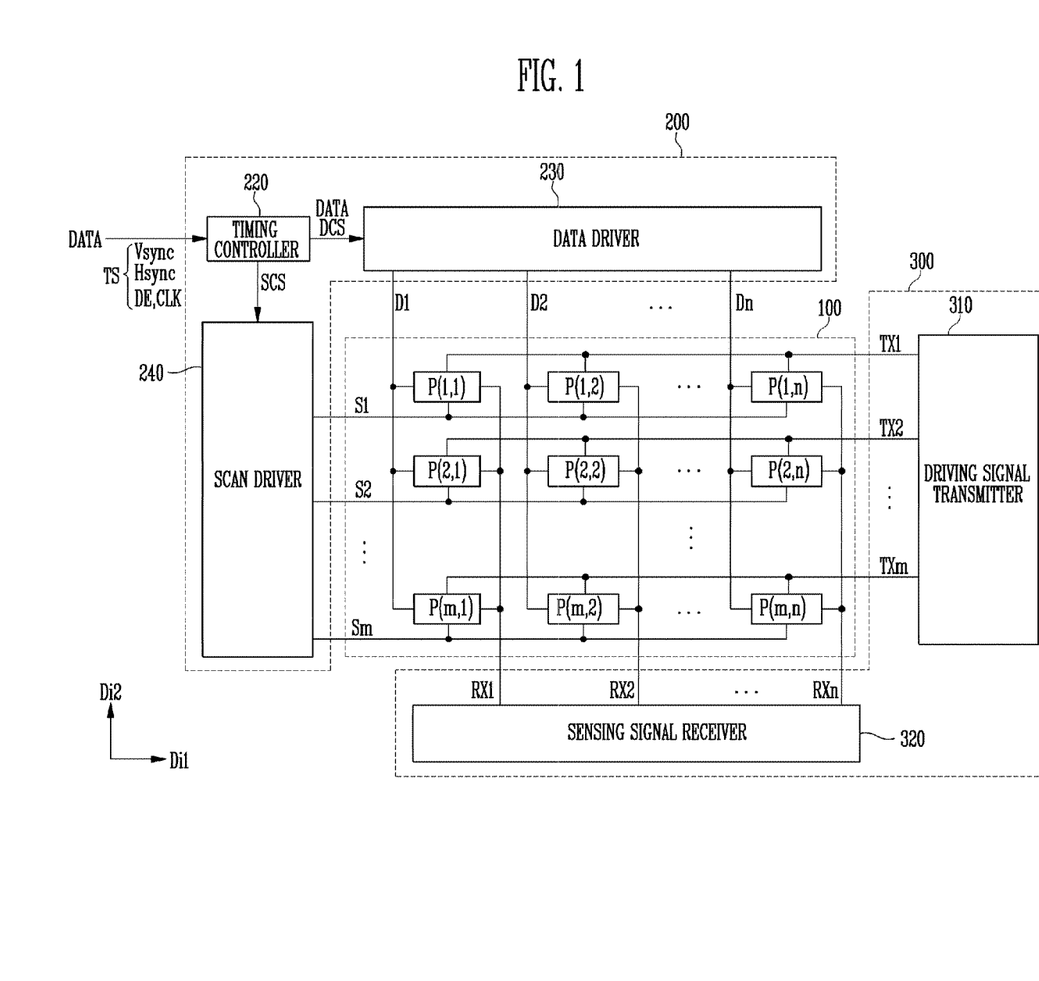
FIG. 1 is a view of a display panel according to an embodiment of the present inventive concept.

FIG. 1 is a view of a display panel according to an embodiment of the present inventive concept. The display device includes a display panel 100, a display panel driver 200, and a touch driver 300.

Referring to FIG. 1, the display panel 100 incudes pixels P(1,1) to P(m,n) (m and n are natural numbers), data lines D1 to Dn (hereinafter, referred to as D) that transmit data voltages to the pixels P(1,1) to P(m,n) (hereinafter, referred to as P) and extend in a second direction Di2, scan lines S1 to Sm (hereinafter, referred to as S) that transmit scan signals to the pixels P and extend in a first direction Di1, driving lines TX1 to TXm (hereinafter, referred to as TX) that transmit driving signals to the pixels P and extend in the first direction Di1, and sensing lines RX1 to RXn (hereinafter, referred to as RX) that transmit sensing signals from the pixels P and extend in the second direction Di2. N pixels P are arranged in the first direction Di1 and m pixels P are arranged in the second direction Di2. A detailed structure of each pixel P will be described with reference to FIGS. 2 to 4.

The display panel driver 200 includes a timing controller 220, a data driver 230, and a scan driver 240.

The timing controller 220 receives image signals DATA and timing signals TS from the outside.

The image signals DATA may respectively correspond to the pixels P. The timing signals TS may include a vertical synchronizing signal Vsync, a horizontal synchronizing signal Hsync, a data enable signal DE, and a dot clock signal CLK.

The timing controller 220 transmits the received image signals DATA to the data driver 230, generates a data timing control signal DCS based on the timing signals TS to transmit the generated data timing control signal DCS to the data driver 230, and generates a scan timing control signal SCS based on the timing signals TS to transmit the generated scan timing control signal SCS to the scan driver 240.

The data driver 230 latches the image signals DATA input from the timing controller 220 in response to the data timing control signal DCS. The data driver 230 includes a plurality of source drive ICs that may be electrically connected to the data lines D of the display panel 100 by a chip on glass (COG) process or a tape automated bonding (TAB) process. The data driver 230 generates the data voltages based on the image signals DATA and may supply the data voltages to the data lines D.

The scan driver 240 sequentially or non-sequentially applies the scan signals to the scan lines S in response to the scan timing control signal SCS. The scan driver 240 is directly formed on a substrate of the display panel 100 during manufacturing thin film transistors by a gate in panel (GIP) method or may be electrically connected to the scan lines S of the display panel 100 by the TAB method.

The touch driver 300 includes a driving signal transmitter 310 and a sensing signal receiver 320.

The driving signal transmitter 310 sequentially or non-sequentially transmits the driving signals to the driving lines TX. The driving signals are supplied to the pixels P through the driving lines TX. The driving lines TX extend substantially parallel to scan lines S.

The sensing signal receiver 320 receives the sensing signals from the pixels P. The sensing signals from the pixels P reach the sensing signal receiver 320 through the sensing lines RX. The sensing lines RX extends substantially parallel to data lines D.

Figure 2:
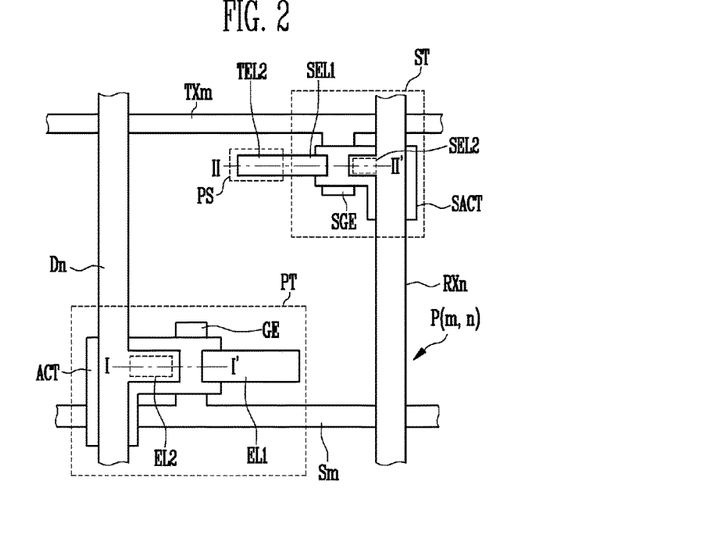
FIG. 2 is a view of an embodiment of a pixel in the display panel of FIG. 1.
Figure 3A:
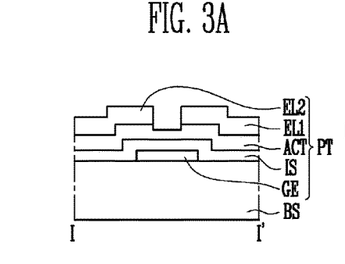
FIG. 3A is a cross-sectional view taken along the line I-I' of the pixel of FIG. 2.
Figure 3B:
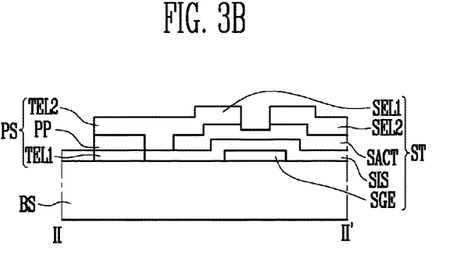
FIG. 3B is a cross-sectional view taken along the line II-II' of the pixel of FIG. 2.
Figure 4:
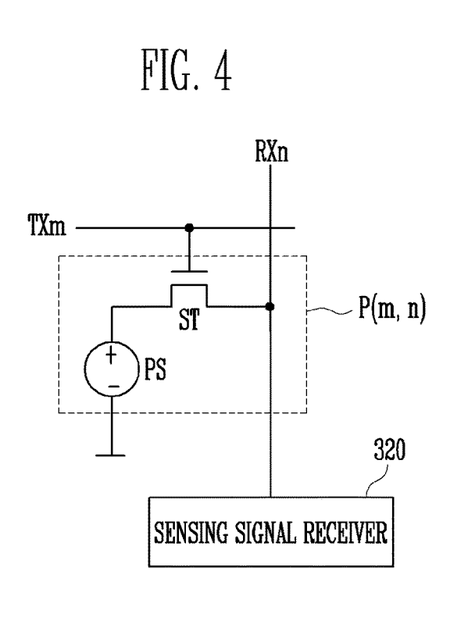
FIG. 4 is a circuit diagram of a part that senses a touch in the pixel of FIG. 2.

FIG. 2 is a view of an embodiment of a pixel in the display panel of FIG. 1. FIG. 3A is a cross-sectional view taken along the line I-I' of the pixel of FIG. 2. FIG. 3B is a cross-sectional view taken along the line II-II' of the pixel of FIG. 2. FIG. 4 is a circuit diagram of a part that senses a touch in the pixel of FIG. 2.

For convenience sake, only the pixel P(m,n) will be described among the pixels P and only a gate electrode, a source electrode, a drain electrode, and a semiconductor pattern that are related to a transistor will be described.

The pixel P(m,n) includes a pixel transistor PT, a piezoelectric sensor PS, and a sensing transistor ST. The pixel P(m,n) is connected to a scan line Sm, a data line Dn, a driving line TXm, and a sensing line RXn.

The pixel transistor PT includes a gate electrode GE provided on a substrate BS and protruding from the scan line Sm, an insulating pattern IS provided on the gate electrode GE, an active pattern ACT provided on the insulating pattern IS, a first electrode EL1 provided on the active pattern ACT, and a second electrode EL2 provided on the active pattern ACT, spaced apart from the first electrode EL1 and protruding from the data line Dn.

The piezoelectric sensor PS includes a first touch electrode TEL1 provided on the substrate BS, a piezoelectric pattern PP provided on the first touch electrode TEL1, and a second touch electrode TEL2 provided on the piezoelectric pattern PP.

The sensing transistor ST includes a sensing gate electrode SGE provided on the substrate BS and protruding from the driving line TXm, a sensing insulating pattern SIS provided on the sensing gate electrode SGE, a sensing active pattern SACT provided on the sensing insulating pattern SIS, a first sensing electrode SEL1 provided on the sensing active pattern SACT, and a second sensing electrode SEL2 provided on the sensing active pattern SACT, spaced apart from the first sensing electrode SEL1 and protruding from the sensing line RXn.

The second touch electrode TEL2 in the piezoelectric sensor PS may be connected to the first sensing electrode SEL1 in the sensing transistor ST.

The gate electrode GE, the first touch electrode TEL1, and the sensing gate electrode SGE may be simultaneously formed. In this case, the gate electrode GE, the first touch electrode TEL1, and the sensing gate electrode SGE may be formed of the same material. The first electrode EL1, the second electrode EL2, the second touch electrode TEL2, the first sensing electrode SEL1, and the second sensing electrode SEL2 may be simultaneously formed. In this case, the first electrode EL1, the second electrode EL2, the second touch electrode TEL2, the first sensing electrode SEL1, and the second sensing electrode SEL2 may be formed of the same material. The material which forms the electrodes GE, TEL1, SGE, EL1, EL2, TEL2, SEL1, and SEL2 has conductivity and may include metals such as aluminum (Al) and copper (Cu).

The insulating pattern IS and the sensing insulating pattern SIS may be simultaneously formed. In this case, the insulating pattern IS and the sensing insulating pattern SIS may be formed of the same material. The material which forms the insulating pattern IS and the sensing insulating pattern SIS has insulating property and may include SiOx and SiNx.

The active pattern ACT, the piezoelectric pattern PP, and the sensing active pattern SACT may be simultaneously formed. In this case, the active pattern ACT, the piezoelectric pattern PP, and the sensing active pattern SACT may be formed of the same material. The material which forms the active pattern ACT, the piezoelectric pattern PP, and the sensing active pattern SACT is a semiconductor and has piezoelectricity. The active pattern ACT, the piezoelectric pattern PP, and the sensing active pattern SACT may be formed of, for example, an oxide semiconductor. The oxide semiconductor may be zinc oxide ZnO. When the active pattern ACT and the piezoelectric pattern PP are simultaneously formed, manufacturing processes become simpler and the number of masks becomes less than when the active pattern ACT and the piezoelectric pattern PP are separately formed. According to the embodiment of FIG. 2, the active pattern ACT and the data line Dn are illustrated as being formed by separate processes. However, the present inventive concept is not limited thereto, the active pattern ACT and the data line Dn may be formed using a same mask.

FIG. 4 is a circuit diagram of a part that senses a touch in the pixel of FIG. 2.

Referring to FIG. 4, when a driving signal is supplied to the driving line TXm, the sensing transistor ST is turned on. The sensing line RXn receives a voltage level of the piezoelectric sensor PS and transmits the received voltage level to the sensing signal receiver 320. When the voltage level of the piezoelectric sensor PS varies in accordance with a deformation of the piezoelectric pattern PP which depends on strength of the touch, the sensing signal receiver 320 receives touch signals and determines occurrence and strength of the touches.

According to the embodiment, all the pixels P do not need the piezoelectric sensors PS and the sensing transistors ST, and some of the pixels P in a predetermined pixel rows and pixel columns may include the piezoelectric sensors PS and the sensing transistors ST.

Figure 5:
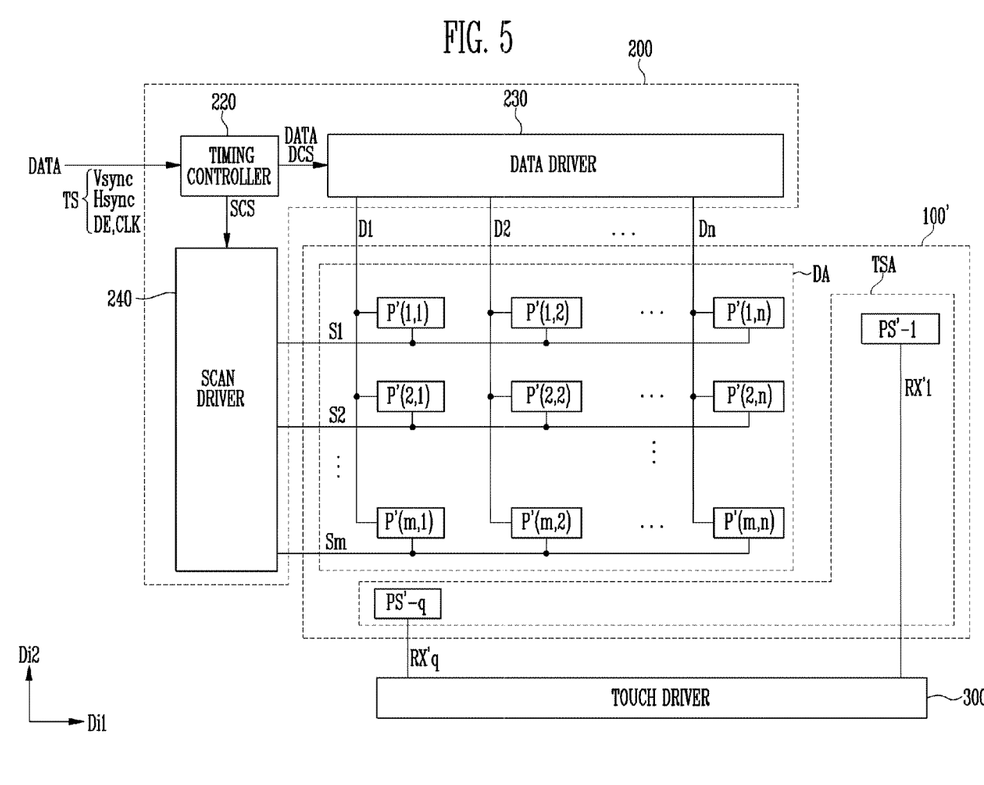
FIG. 5 is a view of a display panel according to another embodiment of the present inventive concept.

FIG. 5 is a view of a display panel according to another embodiment of the present inventive concept.

The display panel of FIG. 5 includes a display panel 100', a display panel driver 200, and a touch driver 300'. Hereinafter, description of the elements denoted by the same reference numerals as those of FIG. 1 will not be given.

The display panel 100' includes a display area DA and a touch sensing area TSA. The display area DA includes pixels P'(1,1) to P'(m,n) (hereinafter, referred to as P'), scan lines S that transmit scan signals to the pixels P', and data lines D that transmit data voltages to the pixels P'. The touch sensing area TSA includes piezoelectric sensors PS'-1 to PS'-q (q is a positive integer) and sensing lines Rx'1 to Rx'q (hereinafter, referred to as Rx') respectively connected to the piezoelectric sensors PS'-1 to PS'-q (hereinafter, referred to as PS').

The touch driver 300' receives touch inputs from the sensing lines Rx' and determines occurrence and strength of touches.

Figure 6A:
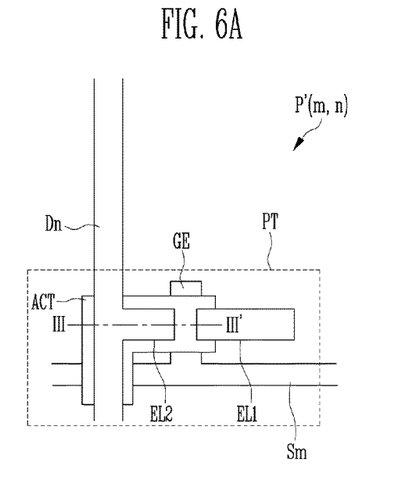
FIG. 6A is a view of an embodiment of a pixel in the display panel of FIG. 5.
Figure 6B:
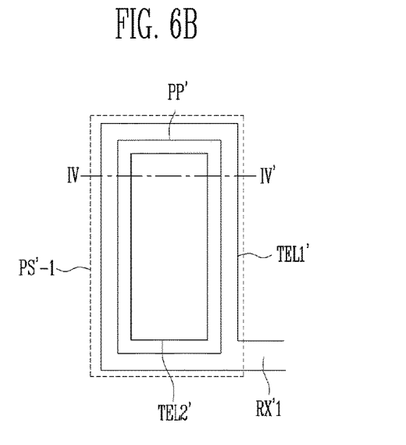
FIG. 6B is a view of an embodiment of a piezoelectric sensor in the display panel of FIG. 5.
Figure 7A:
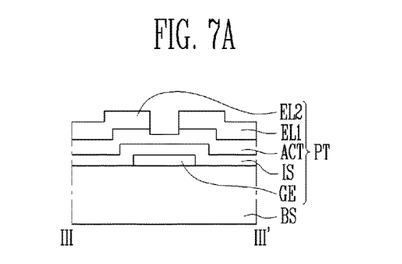
FIG. 7A is a cross-sectional view taken along the line III-III' of the pixel of FIG. 6A.
Figure 7B:
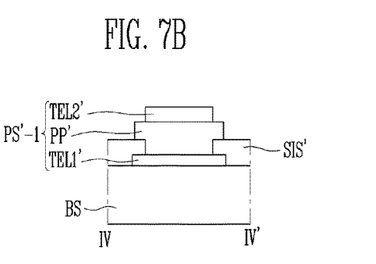
FIG. 7B is a cross-sectional view taken along the line IV-IV' of the piezoelectric sensor of FIG. 6B.

FIG. 6A is a view of an embodiment of a pixel in the display panel of FIG. 5. FIG. 6B is a view of an embodiment of a piezoelectric sensor in the display panel of FIG. 5. FIG. 7A is a cross-sectional view taken along the line III-III' of the pixel of FIG. 6A. FIG. 7B is a cross-sectional view taken along the line IV-IV' of the piezoelectric sensor of FIG. 6B.

For convenience sake, only the pixel P'(m,n) will be described among the pixels P' and only the piezoelectric sensor PS'-1 will be described among the piezoelectric sensors PS'. Since only a gate electrode, a source electrode, a drain electrode, and a semiconductor pattern that are related to a transistor will be described, parts that are less related to the transistor are omitted.

The pixel P'(m,n) includes the pixel transistor PT and is connected to the scan line Sm and the data line Dn.

The pixel transistor PT includes the gate electrode GE provided on the substrate BS, the insulating pattern IS, the active pattern ACT, the first electrode EL1, and the second electrode EL2 as illustrated in FIG. 2.

The piezoelectric sensor PS'-1 includes a first touch electrode TEL1' provided on the substrate BS, a piezoelectric pattern PP' provided on the first touch electrode TEL1', and a second touch electrode TEL2' provided on the piezoelectric pattern PP'. The first touch electrode TEL1' is connected to the sensing line Rx'1. According to an embodiment, a sensing insulating pattern SIS' may be provided on a part of the first touch electrode TEL1'.

According to the embodiment of FIG. 6A, the active pattern ACT and the data line Dn are illustrated as being formed by separate processes. However, the present inventive concept is not limited thereto. The active pattern ACT may be patterned while patterning a data metal layer.

FIGS. 8A to 11B are cross-sectional views of a method of manufacturing the display panel of FIG. 1.

Hereinafter, the method of manufacturing the display panel will be described with reference to FIGS. 1 to 4 in addition.

Figure 8A:
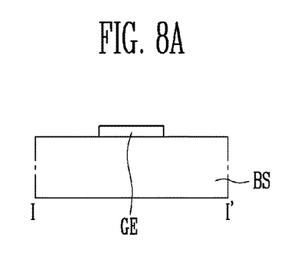
FIGS. 8A, 8B, 9A, 9B, 10A, 10B, 11A and 11B are cross-sectional views of a method of manufacturing the display panel of FIG. 1.
Figure 8B:
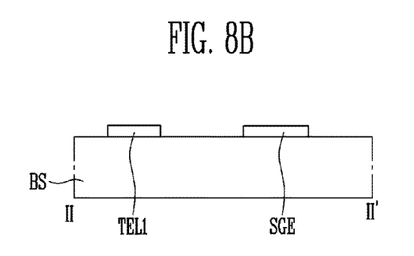

Referring to FIGS. 8A and 8B, the gate electrode GE, the first touch electrode TEL1, and the sensing gate electrode SGE are simultaneously formed on the substrate BS. When the gate electrode GE, the first touch electrode TEL1, and the sensing gate electrode SGE are simultaneously formed, the gate electrode GE, the first touch electrode TEL1, and the sensing gate electrode SGE may be formed of the same material, for example, a conductive metal, during the same process steps.

The gate electrode GE, the first touch electrode TEL1, and the sensing gate electrode SGE may be simultaneously formed by sequentially forming a metal layer, forming a patterned photoresist layer, etching the metal layer, and removing the photoresist layer. However, the gate electrode GE, the first touch electrode TEL1, and the sensing gate electrode SGE may be simultaneously formed using a lift-off process which includes sequentially forming the patterned photoresist layer on areas in which the metal layer is removed, forming the metal layer, and removing the photoresist layer and the metal layer formed on the photoresist layer. Here, the patterned photoresist layer may be formed by using a mask.

Figure 9A:
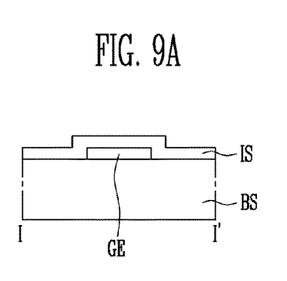
Figure 9B:
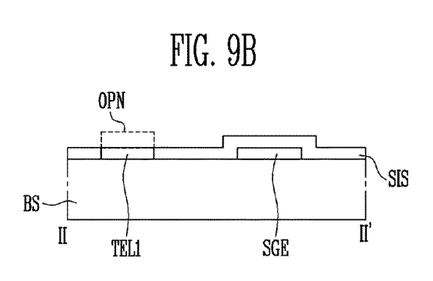

Referring to FIGS. 9A and 9B, the insulating pattern IS and the sensing insulating pattern SIS are simultaneously formed. The insulating pattern IS is formed on the gate electrode GE, the sensing insulating pattern SIS is formed on the sensing gate electrode SGE, and an opening OPN is formed on the first touch electrode TEL1 by removing the sensing insulating pattern SIS on the first touch electrode TEL1. Due to the opening OPN, at least a part of the first touch electrode TEL1 is exposed to the outside. When the insulating pattern IS and the sensing insulating pattern SIS are simultaneously formed, the insulating pattern IS and the sensing insulating pattern SIS may be formed of the same material.

The insulating pattern IS and the sensing insulating pattern SIS may be formed by sequentially forming an insulating layer, forming a patterned photoresist layer, etching the insulating layer on the first touch electrode TEL1, and removing the photoresist layer. Here, the patterned photoresist layer may be formed by using a mask.

Figure 10A:
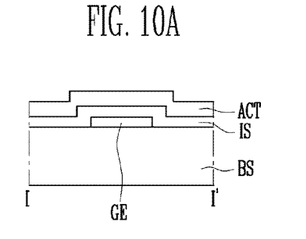
Figure 10B:
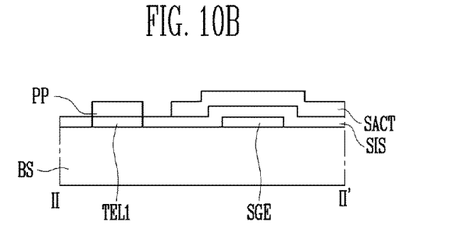

Referring to FIGS. 10A and 10B, the active pattern ACT, the piezoelectric pattern PP, and the sensing active pattern SACT are simultaneously formed. The active pattern ACT is formed on at least a part of the insulating pattern IS, the piezoelectric pattern PP is formed on at least a part of the opening OPN, and the sensing active pattern SACT is formed on at least a part of the sensing insulating pattern SIS. The active pattern ACT may be formed to cover the opening OPN' completely. When the active pattern ACT, the piezoelectric pattern PP, and the sensing active pattern SACT are simultaneously formed, the active pattern ACT, the piezoelectric pattern PP, and the sensing active pattern SACT may be formed of the same material, for example, a piezoelectric oxide semiconductor. Here, the active pattern ACT, the piezoelectric pattern PP, and the sensing active pattern SACT may be formed by using a mask.

The active pattern ACT, the piezoelectric pattern PP, and the sensing active pattern SACT may be formed by sequentially forming an oxide layer, forming a patterned photoresist layer, etching the oxide layer, and removing the photoresist layer. Parts of the active pattern ACT and the sensing active pattern SACT may be doped.

Referring to FIGS. 10A and 10B, the active pattern ACT, the piezoelectric pattern PP, and the sensing active pattern SACT may be formed by using a same mask. That is, since the active pattern ACT and the piezoelectric pattern PP are simultaneously formed, although the piezoelectric sensors PS are included in the pixels P, the number of masks does not excessively increase.

Figure 11A:
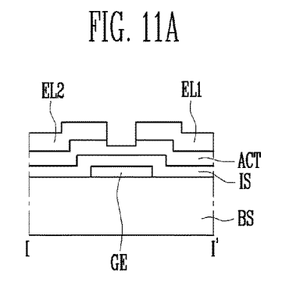
Figure 11B:
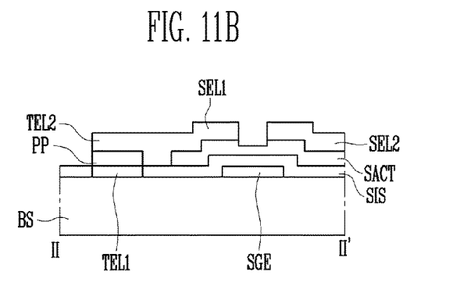

Referring to FIGS. 11A and 11B, the first electrode EL1, the second electrode EL2, the second touch electrode TEL2, the first sensing electrode SEL1, and the second sensing electrode SEL2 are simultaneously formed. The first electrode EL1 and the second electrode EL2 are formed on at least a part of the active pattern ACT not to overlap each other. The second touch electrode TEL2 is formed on the piezoelectric pattern PP. The first sensing electrode SEL1 and the second sensing electrode SEL2 are formed on at least a part of the sensing active pattern SACT not to overlap each other. When the first electrode EL1, the second electrode EL2, the second touch electrode TEL2, the first sensing electrode SEL1, and the second sensing electrode SEL2 are simultaneously formed, the first electrode EL1, the second electrode EL2, the second touch electrode TEL2, the first sensing electrode SEL1, and the second sensing electrode SEL2 may be formed of the same material, for example, a conductive metal. The first sensing electrode SEL1 may be connected to the second touch electrode TEL2.

FIGS. 12A to 15B are cross-sectional views of a method of manufacturing the display panel of FIG. 5.

Hereinafter, the method of manufacturing the display panel will be described with reference to FIGS. 1 to 7 in addition.

Figure 12A:
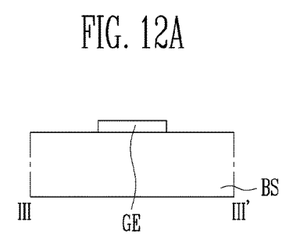
FIGS. 12A, 12B, 13A, 13B, 14A, 14B, 15A and 15B are cross-sectional views of a method of manufacturing the display panel of FIG. 5.
Figure 12B:
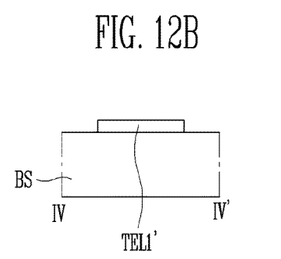

Referring to FIGS. 12A and 12B, the gate electrode GE and the first touch electrode TEL1' are simultaneously formed on the substrate BS. When the gate electrode GE and the first touch electrode TEL1' are simultaneously formed, the gate electrode GE and the first touch electrode TEL1' may be formed of the same material, for example, a conductive metal. Like in FIGS. 8A and 8B, the gate electrode GE and the first touch electrode TEL1' may be simultaneously formed by using a mask.

Figure 13A:
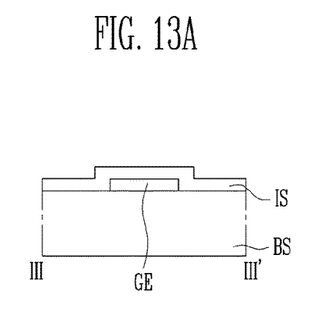
Figure 13B:
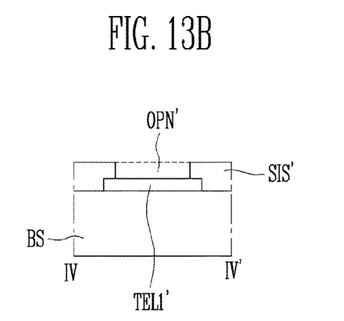

Referring to FIGS. 13A and 13B, the insulating pattern IS and the sensing insulating pattern SIS' are simultaneously formed. The insulating pattern IS is formed on the gate electrode GE, the sensing insulating pattern SIS' is formed on a part of the first touch electrode TEL1', and an opening OPN' is formed on the remaining part of the first touch electrode TEL1'. Due to the opening OPN', at least a part of the first touch electrode TEL1' is exposed to the outside. When the insulating pattern IS and the sensing insulating pattern SIS' are simultaneously formed, the insulating pattern IS and the sensing insulating pattern SIS' may be formed of the same material. Like in FIGS. 9A and 9B, the insulating pattern IS and the sensing insulating pattern SIS' may be simultaneously formed by using a mask.

Figure 14A:
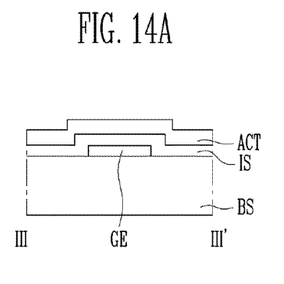
Figure 14B:
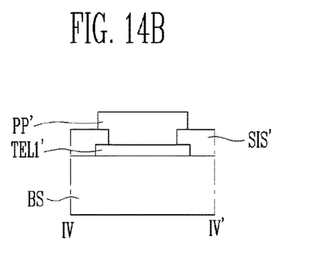

Referring to FIGS. 14A and 14B, the active pattern ACT and the piezoelectric pattern PP' are simultaneously formed. The active pattern ACT is formed on at least a part of the insulating pattern IS and the piezoelectric pattern PP' is formed on at least a part of the opening OPN'. The piezoelectric pattern PP' may be formed to cover the opening OPN' completely. When the active pattern ACT and the piezoelectric pattern PP' are simultaneously formed, the active pattern ACT and the piezoelectric pattern PP' may be formed of the same material, for example, a piezoelectric oxide semiconductor.

The active pattern ACT and the piezoelectric pattern PP' may be formed by sequentially forming an oxide layer having piezoelectric property, forming a patterned photoresist layer, etching the oxide layer having piezoelectric property, and removing the photoresist layer. Like in FIGS. 10A and 10B, the active pattern ACT and the piezoelectric pattern PP' may be simultaneously formed by using a same material and be patterned using a same mask. A part of the active pattern ACT may be doped.

Referring to FIGS. 14A and 14B, the active pattern ACT and the piezoelectric pattern PP' may be formed by using the same mask. That is, since the active pattern ACT and the piezoelectric pattern PP' are simultaneously formed, although the piezoelectric sensors PS' are included in the display panel 100, the number of masks does not excessively increase.

Figure 15A:
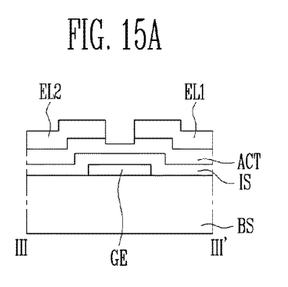
Figure 15B:
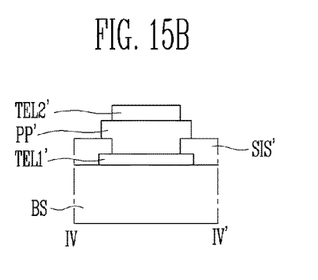

Referring to FIGS. 15A and 15B, the first electrode EL1, the second electrode EL2, and the second touch electrode TEL2' are simultaneously formed. The first electrode EL1 and the second electrode EL2 are formed on at least a part of the active pattern ACT not to overlap each other. The second touch electrode TEL2' is formed on the piezoelectric pattern PP'. When the first electrode EL1, the second electrode EL2, and the second touch electrode TEL2' are simultaneously formed, the first electrode EL1, the second electrode EL2, and the second touch electrode TEL2' may be formed of the same material, for example, a conductive metal.

The first electrode EL1, the second electrode EL2, and the second touch electrode TEL2' may be simultaneously formed by sequentially forming a metal layer, forming a patterned photoresist layer, etching the metal layer, and removing the photoresist layer. However, the first electrode EL1, the second electrode EL2, and the second touch electrode TEL2' may be simultaneously formed using a lift-off process which includes sequentially forming the patterned photoresist layer on areas in which the metal layer is removed, forming the metal layer, and removing the photoresist layer and the metal layer formed on the photoresist layer. Here, the patterned photoresist layer may be formed by using a mask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A pixel comprising:
a pixel transistor including a gate electrode provided on a substrate and protruding from a scan line, an active pattern provided on the gate electrode, a first electrode provided on the active pattern, and a second electrode provided on the active pattern and protruding from a data line; and
a piezoelectric sensor including a first touch electrode provided on the substrate and a piezoelectric pattern provided on the first touch electrode,
wherein the gate electrode and the first touch electrode are formed of a same material, and
wherein the active pattern and the piezoelectric pattern are formed of a same material.

2. The pixel of claim 1,
wherein the piezoelectric sensor further comprises a second touch electrode provided on the piezoelectric pattern, and
wherein the first electrode and the second touch electrode are formed of a same material.

3. The pixel of claim 1, wherein the active pattern comprises an oxide semiconductor.

4. The pixel of claim 3, wherein the oxide semiconductor is zinc oxide.

5. The pixel of claim 1,
wherein the pixel further comprises a sensing transistor,
wherein the sensing transistor further comprises:
a sensing gate electrode provided on the substrate and protruding from a driving line;
a sensing active pattern provided on the sensing gate electrode;
a first sensing electrode provided on the sensing active pattern; and
a second sensing electrode provided on the sensing active pattern and protruding from a sensing line,
wherein the first sensing electrode and the second touch electrode are connected to each other, and
wherein the gate electrode and the sensing gate electrode are formed of a same material, the active pattern and the sensing active pattern are formed of a same material, and the first electrode and the first sensing electrode are formed of a same material.

6. The pixel of claim 5,
wherein the pixel transistor further comprises an insulating pattern provided between the gate electrode and the active pattern,
wherein the sensing transistor further comprises a sensing insulating pattern provided between the sensing gate electrode and the sensing active pattern, and
wherein the insulating pattern and the sensing insulating pattern are formed of a same material.

7. The pixel of claim 5,
wherein, when a touch of a user occurs around the pixel, voltage levels of the piezoelectric pattern and the first sensing electrode are changed by the touch, and
wherein, when a driving signal is supplied to the driving line, a voltage of the sensing line changes.

8. A display panel comprising:
pixels provided in a display area;
scan lines configured to transmit scan signals to the pixels;
data lines configured to transmit data voltages to the pixels;
piezoelectric sensors at least partially provided outside the display area; and
sensing lines connected to the piezoelectric sensors to receive sensing signals from the piezoelectric sensors,
wherein at least one of the pixels comprises a pixel transistor,
wherein the pixel transistor comprises:

a gate electrode provided on a substrate and protruding from one of the scan lines;
an active pattern provided on the gate electrode;
a first electrode provided on the active pattern; and
a second electrode provided on the active pattern and protruding from one of the data lines,
wherein a first piezoelectric sensor among the piezoelectric sensors comprises:
a first touch electrode provided on the substrate; and
a piezoelectric pattern provided on the first touch electrode, and
wherein the gate electrode and the first touch electrode are formed of a same material, the active pattern and the piezoelectric pattern are formed of a same material, and the first and the second touch electrode are formed of a same material.

9. The display panel of claim 8, wherein, when a touch of a user occurs around the first piezoelectric sensor, voltage levels of the piezoelectric pattern and the first touch electrode are changed by the touch.

10. The display panel of claim 9,
wherein the first piezoelectric sensor further comprises a second touch electrode provided on the piezoelectric pattern, and
wherein the first electrode and the second touch electrode are formed of a same material.

11. The display panel of claim 10, wherein the active pattern comprises an oxide semiconductor.

12. The display panel of claim 11, wherein the oxide semiconductor is zinc oxide.

13. The display panel of claim 10, wherein, when a touch of a user occurs around the first piezoelectric sensor, a difference in voltage level between the first touch electrode and the second touch electrode is changed by the touch.

* * * * *